United States Patent
Shi et al.

(10) Patent No.: US 8,697,577 B2
(45) Date of Patent: Apr. 15, 2014

(54) METHOD AND COMPOSITION FOR CHEMICAL MECHANICAL PLANARIZATION OF A METAL OR A METAL ALLOY

(75) Inventors: Xiaobo Shi, Chandler, AZ (US); Bentley J. Palmer, Phoenix, AZ (US); Rebecca A. Sawayda, Gilbert, AZ (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 13/561,398

(22) Filed: Jul. 30, 2012
(Under 37 CFR 1.47)

(65) Prior Publication Data
US 2013/0102153 A1    Apr. 25, 2013

Related U.S. Application Data

(62) Division of application No. 12/632,918, filed on Dec. 8, 2009, now Pat. No. 8,252,688.

(60) Provisional application No. 61/141,706, filed on Dec. 31, 2008.

(51) Int. Cl.
*H01L 21/302* (2006.01)

(52) U.S. Cl.
USPC ........ 438/692; 252/79.1; 252/79.2; 252/79.3; 252/79.4; 438/689; 438/690; 438/691

(58) Field of Classification Search
USPC .......................... 252/79.1–79.4; 438/689–692
See application file for complete search history.

(56) References Cited

U.S. PATENT DOCUMENTS

2008/0087644 A1    4/2008  Nishioka et al.

OTHER PUBLICATIONS

G. B. Shinn, et al, Chemical-Mechanical Polish, Handbook of Semiconductor Manufacturing Technology, 2000, Marcel Dekkar, New York City, 415-460.
D. Zeidler, et al, Characterization of Cu chemical mechanical polishing by electrochemical investigations, Microelectronic Engineering, 33, 1997, 259-265.
R. J. Gutmann, et al, Chemical-mechanical polishing of copper with oxide and polymer interlevel dielectrics, Thin Solid Films, 270, 1995, 596-600.

*Primary Examiner* — Nadine Norton
*Assistant Examiner* — Maki Angadi
(74) *Attorney, Agent, or Firm* — Lina Yang

(57) ABSTRACT

A composition and associated method for chemical mechanical planarization of a metal-containing substrate (e.g., a copper substrate) are described herein which afford high and tunable rates of metal removal as well as low dishing and erosion levels during CMP processing.

8 Claims, No Drawings

METHOD AND COMPOSITION FOR CHEMICAL MECHANICAL PLANARIZATION OF A METAL OR A METAL ALLOY

CROSS REFERENCE TO RELATED APPLICATIONS

This application is a divisional application of U.S. patent application Ser. No. 12/632,918, filed on Dec. 8, 2009, which claimed the benefit of U.S. Provisional Patent Application Ser. No. 61/141,706 filed Dec. 31, 2008.

BACKGROUND OF THE INVENTION

Described herein is a method for the chemical-mechanical planarization ("CMP") of metal substrates such as, for example, copper substrates on semiconductor wafers and polishing compositions therefore. More particularly, also described herein is a CMP polishing composition and method comprising same that is effective for use in metal CMP and provides at least one of the following: affords a high level of metal or metal alloy removal, provides for tune-ability in the removal rate of metal or metal alloy during CMP processing, and/or results in low dishing and erosion levels during CMP processing.

Chemical mechanical planarization (also referred to as chemical mechanical polishing) for planarization of semiconductor substrates is now widely known to those skilled in the art and has been described in numerous patents and open literature publications. An introductory reference on CMP is as follows: "Chemical-Mechanical Polish" by G. B. Shinn et al., Chapter 15, pages 415-460, in Handbook of Semiconductor Manufacturing Technology, editors: Y. Nishi and R. Doering, Marcel Dekker, New York City (2000).

In a typical CMP process, a substrate such as a wafer is placed in contact with a rotating polishing pad attached to a platen. A CMP slurry, typically an abrasive and chemically reactive mixture, is supplied to the pad during CMP processing of the substrate. During the CMP process, the pad which may be fixed to the platen and substrate are rotated while a wafer carrier system or polishing head applies pressure such as a downward force against the substrate. The polishing composition accomplishes the planarization (polishing) process by chemically and mechanically interacting with the substrate film being planarized due to the effect of the rotational movement of the pad relative to the substrate. Polishing is continued in this manner until the desired film on the substrate is removed with the usual objective being to effectively planarize the substrate. Typically metal CMP slurries contain an abrasive material, such as silica or alumina, which is suspended in an oxidizing, aqueous medium.

Silicon based semiconductor devices, such as integrated circuits (ICs), typically include a dielectric layer, which can be a low-k dielectric material, silicon dioxide, or other material. Multilevel circuit traces, typically formed from aluminum or an aluminum alloy or copper, are patterned onto the low-k or silicon dioxide substrate.

CMP processing is often employed to remove and planarize excess metal at different stages of semiconductor manufacturing. For example, one way to fabricate a multi-level copper interconnect or planar copper circuit traces on a silicon dioxide substrate is referred to as the damascene process. In a semiconductor manufacturing process typically used to form a multilevel copper interconnect, metallized copper lines or copper vias are formed by electrochemical metal deposition followed by copper CMP processing. In a typical process, the interlevel dielectric (ILD) surface is patterned by a conventional dry etch process to form vias and trenches for vertical and horizontal interconnects and make connection to the sublayer interconnect structures. The patterned ILD surface is coated with an adhesion-promoting layer such as titanium or tantalum and/or a diffusion barrier layer such as titanium nitride or tantalum nitride over the ILD surface and into the etched trenches and vias. The adhesion-promoting layer and/or the diffusion barrier layer is then overcoated with copper, for example, by a seed copper layer and followed by an electrochemically deposited copper layer. Electro-deposition is continued until the structures are filled with the deposited metal. Finally, CMP processing is used to remove the copper overlayer, adhesion-promoting layer, and/or diffusion barrier layer, until a planarized surface with exposed elevated portions of the dielectric (silicon dioxide and/or low-k) surface is obtained. The vias and trenches remain filled with electrically conductive copper forming the circuit interconnects.

When one-step copper CMP processing is desired, it is usually desirable that the removal rate of the metal and barrier layer material be significantly higher than the removal rate for dielectric material in order to avoid or minimize dishing of metal features or erosion of the dielectric. Alternatively, a multi-step copper CMP process may be employed involving the initial removal and planarization of the copper overburden, referred to as a step 1 copper CMP process, followed by a barrier layer CMP process. The barrier layer CMP process is frequently referred to as a barrier or step 2 copper CMP process. Previously, it was believed that the removal rate of the copper and the adhesion-promoting layer and/or the diffusion barrier layer should both greatly exceed the removal rate of dielectric so that polishing effectively stops when elevated portions of the dielectric are exposed. The ratio of the removal rate of copper to the removal rate of dielectric base is called the "selectivity" for removal of copper in relation to dielectric during CMP processing of substrates comprised of copper, tantalum and dielectric material. The ratio of the removal rate of tantalum to the removal rate of dielectric base is called the "selectivity" for removal of tantalum in relation to dielectric during CMP processing. When CMP slurries with high selectivity for removal of copper and tantalum in relation to dielectric are used, the copper layers are easily over-polished creating a depression or "dishing" effect in the copper vias and trenches. This feature distortion is unacceptable due to lithographic and other constraints in semiconductor manufacturing.

Another feature distortion that is unsuitable for semiconductor manufacturing is called "erosion." Erosion is the topography difference between a field of dielectric and a dense array of copper vias or trenches. In CMP, the materials in the dense array maybe removed or eroded at a faster rate than the surrounding field of dielectric. This causes a topography difference between the field of dielectric and the dense copper array.

A typically used CMP slurry has two components: a chemical component and a mechanical component. An important consideration in slurry selection is "passive etch rate." The passive etch rate is the rate at which copper is dissolved by the chemical component alone and should be significantly lower than the removal rate when both the chemical component and the mechanical component are involved. A large passive etch rate leads to dishing of the copper trenches and copper vias, and thus, preferably, the passive etch rate is less than 10 nanometers per minute.

In relation to copper CMP, the current state of this technology involves the use of a two-step process to achieve local and global planarization in the production of IC chips. During step 1 of a copper CMP process, the overburden copper is removed. Then step 2 of the copper CMP process follows to remove the barrier layer and achieve both local and global planarization. Generally, after removal of overburden copper in step 1, polished wafer surfaces have non-uniform local and global planarity due to differences in the step heights at various locations of the wafer surfaces. Low density features tend to have higher copper step heights whereas high density features tend to have low step heights. Due to differences in the step heights after step 1, step 2 copper CMP selective slurries with respect to tantalum to copper removal rates and copper to oxide removal rates are highly desirable. The ratio of the removal rate of tantalum to the removal rate of copper is called the "selectivity" for removal of tantalum in relation to copper during CMP processing of substrates comprised of copper, tantalum and dielectric material.

There are a number of theories as to the mechanism for chemical-mechanical polishing of copper, proposing that the chemical component forms a passivation layer on the copper changing the copper to a copper oxide. The copper oxide has different mechanical properties, such as density and hardness, than metallic copper and passivation changes the polishing rate of the abrasive portion. It is also proposed that the mechanical component abrades elevated portions of copper and the chemical component then dissolves the abraded material. The chemical component also passivates recessed copper areas minimizing dissolution of those portions. See also: D. Zeidler, Z. Stavreva, M. Ploetner, K. Drescher, "Characterization of Cu Chemical Mechanical Polishing by Electrochemical Investigations" (*Microelectronic Engineering*, 33(104), 259-265 (English) 1997), and Gutmann, et al., entitled "Chemical-Mechanical Polishing of Copper with Oxide and Polymer Interlevel Dielectrics" (*Thin Solid Films*, 1995).

There are two general types of layers that can be polished. One layer may be interlayer dielectrics (ILD), such as silicon oxide and silicon nitride. Another layer may be metal layers such as tungsten, copper, aluminum, etc., which are used to connect the active devices.

In the case of CMP of metals, the chemical action is generally considered to take one of two forms. In the first mechanism, the chemicals in the solution react with the metal layer to continuously form an oxide layer on the surface of the metal. This generally requires the addition of an oxidizer to the solution, such as; hydrogen peroxide, ferric nitrate, etc. Then the mechanical abrasive action of the particles continuously and simultaneously removes this oxide layer. A judicious balance of these two processes obtains optimum results in terms of removal rate and polished surface quality.

In the second mechanism, no protective oxide layer is formed. Instead, the constituents in the solution chemically attack and dissolve the metal, while the mechanical action is largely one of mechanically enhancing the dissolution rate by such processes as continuously exposing more surface area to chemical attack, raising the local temperature (which increases the dissolution rate) by the friction between the particles and the metal and enhancing the diffusion of reactants and products to and away from the surface by mixing and by reducing the thickness of the boundary layer.

While prior art CMP systems are capable of removing a copper overlayer from a silicon dioxide substrate, the present systems may not satisfy the rigorous demands of the semiconductor industry. These requirements can be summarized as follows. First, there is a need for high removal rates of copper to satisfy throughput demands. Secondly, there should be excellent topography uniformity across the substrate. Finally, the CMP method should minimize dishing and local erosion effects on polished substrates, as well as minimizing defectivity levels to satisfy ever increasing lithographic demands.

There is a need for copper CMP process(es) and compositions that afford high metal removal rates that are tune-able while at the same time affording low dishing and erosion levels during CMP processing. These characteristics may become important in view of the fact that the semiconductor industry continues to move towards smaller and smaller feature sizes.

BRIEF SUMMARY OF THE INVENTION

Described herein are CMP processes and polishing compositions for the CMP processing of a substrate comprising a metal or alloy thereof. In one embodiment, described herein is a method for chemical mechanical planarization of a surface having at least one feature thereon comprising a metal, which comprises the steps of:

A) placing a substrate comprising a surface having the at least one feature thereon comprising the metal or the metal alloy in contact with a polishing pad;

B) delivering a polishing composition comprising:
   a) an abrasive;
   b) a naphthalene imide derivative; and,
   c) an oxidizing agent;

C) polishing the substrate with the polishing composition.

In one particular embodiment of the method described herein, the naphthalene imide derivative is selected from the group consisting of Type 1 naphthalene imide derivative, Type 2 naphthalene imide derivative, and Type 3 naphthalene imide derivative.

In a further embodiment, described herein is a polishing composition comprising:
   a) an abrasive;
   b) a naphthalene imide derivative; and,
   c) an oxidizing agent.

In one particular embodiment of the above composition, the naphthalene imide derivative is selected from the group consisting of Type 1 naphthalene imide derivative, Type 2 naphthalene imide derivative, and Type 3 naphthalene imide derivative.

DETAILED DESCRIPTION OF THE INVENTION

Described herein are polishing compositions for CMP processing and methods for polishing and, in particular, for a chemical mechanical polishing with a composition comprising a naphthalene imide derivative, an abrasive and optionally an oxidizing agent. It is believed that these compositions provide high levels of metal removal and while also providing desirable low levels of dishing and/or erosion during CMP processing. Achieving high metal removal rates with tuneability while simultaneously achieving low dishing and erosion levels during CMP processing may become more important as the semiconductor industry trends to smaller and smaller feature sizes in the manufacture of integrated circuits.

As previously mentioned, the polishing compositions and methods using same comprise a naphthalene imide derivative. Exemplary naphthalene imide derivatives that can be used in the method and composition described herein include, but are not limited to, Type 1, Type 2, and Type 3 naphthalene imide derivatives that are described below.

In one embodiment, the polishing composition comprises a Type 1 napthalene imide derivate. Type 1 naphthalene imide derivatives have the following generalized structure:

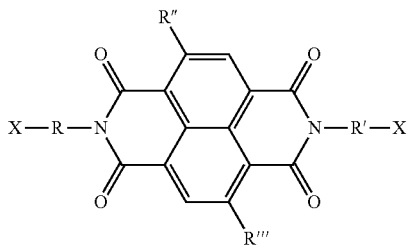

In another embodiment, the polishing composition comprises a Type 2 napthalene imide derivative. Type 2 naphthalene imide derivatives have the following generalized structure:

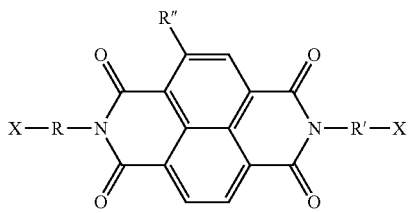

In yet another embodiment, the polishing composition comprises a Type 3 napthalene imide derivative. Type 3 naphthalene imide derivatives have the following generalized structure:

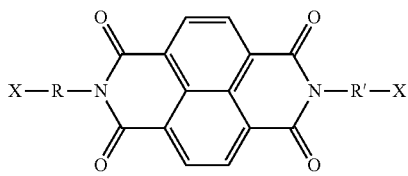

With regard to the above structures for Types 1, 2, and 3 naphthalene imide derivatives, the R, X, R', and R" substituents can each independently be any of the atom, groups, or moieties as listed below. Suitable atoms and organic groups for substituents may include, but are not limited to, H, normal-alkyl, branched alkyl, alkoxy, alkyl thioether, cyano, and other suitable organic groups. The term alkyl as used herein is an organic group that can have from 1 to 20 or 1 to 12 or 1 to 6 carbon atoms and may be unless indicated otherwise substituted, unsubstituted, cyclic, branched, or linear. The other suitable organic groups include, but are not limited to, organic functional groups that are covalently bound to the naphthalene imide moiety as pendant groups. Illustrative examples of such functional groups include, but are not limited to, carboxylic acid, carboxylic ester, ethylene glycol radical, amino acid, and imine.

It is believed that the naphthalene imide derivatives described herein when present in the polishing compositions exhibits at least one of the following properties. First, all of the aforementioned three types of naphthalene imide derivatives are considered n-type organic electronic materials. These n-type naphthalene imide derivatives may be used and function as charge transfer process catalyst that occur in CMP slurry induced redox reactions in CMP processes. Through multi-coordination functional groups or atoms, one of these three types of naphthalene imide derivatives can be bonded to the multi-metal cation centers in the lattice structures of metal oxides. The chemical bonding between metal cations and these three types of naphthalene imide derivatives make them suitable inhibitors to tune the polishing and improve dishing and reduce erosion when used as one component in CMP slurries used for polishing metal or metal alloy surfaces. By molecular structure designing, various functional groups can be added at side-chain positions, such as R—X, R'X, R", and R''', respectively, so that the molecular moieties possessing useful functions can be added into the basic molecular building block, which is one of the three types of naphthalene imide derivatives shown above. Water-soluble promoters can be added onto pendant positions. Metal-dissolving promoter also can be added onto pendant positions, such as, but not limited to, alpha-amino acids, and any other type of organic acids. Other corrosion inhibitors can also be added onto R—X, R'X, R", and R''' positions, respectively. Therefore, some novel metal corrosion inhibitors can be derived from these three types of naphthalene imide derivatives. Due to the planar structural geometry posed by the molecular building core, the naphthalene imide derivatives are expected to have very small tilting angles when they are bonded to metal cations located within metal oxide lattices. Thus, this bonding geometry may lead to the different degree protection of metal from further oxidation or erosion when used as additives in CMP polishing compositions.

Levels of naphthalene imide derivative(s) useful that can be used in the polishing composition range from about 1 ppm to about 1 weight percent (10,000 ppm). In one embodiment, the level of naphthalene imide derivative(s) ranges from about 5 ppm to about 5000 ppm. In another embodiment, the level of naphthalene imide derivative(s) ranges from about 25 ppm to about 500 ppm.

The polishing compositions and methods using same can have a pH value that ranges from about 4 to about 10. In one embodiment, the pH ranges from about 5 to about 9. In another embodiment, the pH ranges from about 6 to about 8. In yet another embodiment, the pH ranges from about 6.5 to about 7.5. In a further embodiment, the polishing composition has a pH value near 7 (neutral).

As previously mentioned, the polishing composition further comprises an abrasive. Suitable abrasives for this invention include, but are not limited to, alumina, ceria, Germania, silica, titania, zirconia, and mixtures thereof. In one embodiment, the abrasive is silica such as, for example, colloidal silica or fumed silica. In another embodiment, the abrasive is colloidal silica. The abrasive level in the polishing composition can range from in concentration of about 10 ppm to about 25 weight % of the total weight of the polishing composition. In one particular embodiment, the abrasive level is relatively low and may ranges from about 10 ppm to about 2 weight percent of the total weight of the polishing composition. In an alternative embodiment, the abrasive level is about 10 ppm to about 1 weight percent of the total weight of the polishing composition. In a still further embodiment, the abrasive level may range from about 25 ppm to about 100 ppm of the total weight of the polishing composition.

The polishing composition may optionally include an oxidizing agent. In embodiments having an oxidizing agent, the oxidizing agent can be any suitable oxidizing agent. Suitable oxidizing agents include, for example, one or more per-compounds, which comprise at least one peroxy group (—O—O—). Suitable per-compounds include, for example, peroxides, persulfates (e.g., monopersulfates and dipersulfates), percarbonates, and acids thereof, and salts thereof, and mixtures thereof. Other suitable oxidizing agents include, for example, oxidized halides (e.g., chlorates, bromates, iodates, perchlorates, perbromates, periodates, and acids thereof, and mixtures thereof, and the like), perboric acid, perborates, percarbonates, peroxyacids (e.g., peracetic acid, perbenzoic acid, m-chloroperbenzoic acid, salts thereof, mixtures thereof, and the like), permanganates, chromates, cerium compounds, ferricyanides (e.g., potassium ferricyanide), mixtures thereof, and the like. Some specific oxidizers that are useful in composition and method described herein include, but are not limited to, hydrogen peroxide, periodic acid, potassium iodate, potassium permanganate, ammonium persulfate, ammonium molybdate, ferric nitrate, nitric acid, potassium nitrate, ammonia, and other amine compounds, and mixtures thereof. Preferred oxidizing agents include, for example, hydrogen peroxide and urea-hydrogen peroxide.

In one particular embodiment, the composition comprises (hydrogen peroxide) $H_2O_2$ as an oxidizing agent. In this embodiment, the concentration of $H_2O_2$ may range from about 0.2 weight % to about 5 weight % of the total weight of the polishing composition. In another embodiment, the concentration of $H_2O_2$ may range from about 0.5 weight % to about 2 weight % of the total weight of the polishing composition. In yet another embodiment, the concentration of $H_2O_2$ may range from about 0.5 weight % to about 1.5 weight % of the total weight of the slurry.

Other chemicals that may be optionally added to the CMP polishing composition include, for example, surfactants, pH-adjusting agents, acids, corrosion inhibitors, fluorine-containing compounds, chelating agents, nitrogen-containing compounds, salts, biological agents, and combinations thereof.

In embodiments wherein a surfactant is added to the polishing composition, suitable surfactant compounds that may be added to the polishing composition include, for example, any of the numerous nonionic, anionic, cationic or amphoteric surfactants known to those skilled in the art. In these embodiments, the surfactant may present in the composition may range from about 0 weight % to about 1 weight % or from about 0.001 weight % to about 0.1 weight % of the total weight of the composition. In one particular embodiment, the surfactant(s) are nonionic, anionic, or mixtures thereof and are present in a concentration ranging about 10 ppm to about 1000 ppm of the total weight of the slurry. One suitable nonionic surfactant is Surfynol® 104E, which is a 50:50 mixture by weight of 2,4,7,9-tetramethyl-5-decyn-4,7-diol and ethylene glycol (solvent), (Air Products and Chemicals, Allentown, Pa.). Another suitable anionic surfactants includes cetyl trimethylammonium bromide and ammonium lauryl sulfate. In other embodiments, the polishing composition does not include a surfactant.

In certain embodiments, the polishing composition further comprises a pH-adjusting agent. In these embodiments, the pH-adjusting agent may be used, for example, to improve the stability of the polishing composition, improve the safety in handling and use, and/or meet the requirements of various regulations. The pH-adjusting agent may be used to raise or lower the pH of the polishing composition. Suitable pH-adjusting agents to lower the pH of the polishing composition include, but are not limited to, hydrochloric acid, nitric acid, sulfuric acid, chloroacetic acid, tartaric acid, succinic acid, citric acid, malic acid, malonic acid, various fatty acids, various polycarboxylic acids and mixtures thereof. Suitable pH-adjusting agents to raise the pH of the polishing composition include, but are not limited to, potassium hydroxide, sodium hydroxide, ammonia, tetramethylammonium hydroxide, ethylenediamine, piperazine, polyethyleneimine, modified polyethyleneimines, and mixtures thereof.

In certain embodiments, the polishing composition further comprises an acid compound. Suitable acid compounds that may be added to the polishing composition include, but are not limited to, formic acid, acetic acid, propanoic acid, butanoic acid, pentanoic acid, hexanoic acid, heptanoic acid, octanoic acid, nonanoic acid, lactic acid, hydrochloric acid, nitric acid, phosphoric acid, sulfuric acid, hydrofluoric acid, malic acid, tartaric acid, gluconic acid, citric acid, phthalic acid, pyrocatechoic acid, pyrogallol carboxylic acid, gallic acid, tannic acid, and mixtures thereof. In these embodiments, the acid compound(s) may be present in the polishing composition in an amount ranging from about 0 weight % to about 1 weight % of the total weight of the slurry.

In certain embodiments, the polishing composition further comprises a fluorine-containing compound to, for example, increase the removal rates of the slurry for tantalum and tantalum compounds as well as copper relative to silicon dioxide. Suitable fluorine-containing compounds include, but are not limited to, hydrogen fluoride, perfluoric acid, alkali metal fluoride salt, alkaline earth metal fluoride salt, ammonium fluoride, tetramethylammonium fluoride, ammonium bifluoride, ethylenediammonium difluoride, diethylenetriammonium trifluoride, and mixtures thereof. The fluorine-containing compounds may be present in the polishing composition in a concentration of about 0 weight % to about 5 weight %, or about 0.10 weight % to about 2 weight % of the total weight of the polishing composition. In one particular embodiment, the fluorine-containing compound is ammonium fluoride, which is present in a concentration of about 0 weight % to about 1 weight % of the total weight of the polishing composition.

In certain embodiments, the polishing composition further comprises a chelating agent. Suitable chelating agents that may be added to the polishing composition include, but are not limited to, ethylenediaminetetracetic acid (EDTA), N-hydroxyethylethylenediaminetriacetic acid (NHEDTA), nitrilotriacetic acid (NTA), diethylenetriaminepentacetic acid (DPTA), ethanoldiglycinate, tricine, 2,2'-bipyridyl, tartaric acid, glutamic acid, aspartic acid, glutamine, L-aspartic acid, L-tryptophan, L-asparagine, L-arginine and mixtures thereof. The chelating agents may be present in the polishing composition in a concentration of about 0 weight % to about 3 weight %, and are preferably present in a concentration of about 0.05 weight % to about 0.20 weight % of the total weight of the polishing composition. Preferred chelating agents are tricine and EDTA and are most preferably present in a concentration of about 0.05 weight % to about 0.20 weight % of the total weight of the polishing composition.

In certain embodiments, the polishing composition further comprises nitrogen-containing compound. Suitable nitrogen-containing compounds that may be added to the polishing composition include, but are not limited to, ammonium hydroxide, hydroxylamine, monoethanolamine, diethanolamine, triethanolamine, diethyleneglycolamine, N-hydroxylethylpiperazine, polyethyleneimine, modified polyethyleneimines, and mixtures thereof. Suitable nitrogen-containing compounds also include various amino acids. Suitable amino acids include, but are not limited to, alanine, arginine, asparagine, aspartic acid, cysteine, glutamic acid, glutamine, glycine, histidine, isoleucine, leucine, lysine, methionine, phenylalanine, proline, serine, threonine, tryptophan, tyrosine, and valine. In an embodiment, the amino acid is glycine. The nitrogen-containing compounds may be present in the polishing composition in a concentration of about 0 weight % to about 1 weight %, or present in a concentration of about 0.01 weight % to about 0.20 weight % of the total weight of the polishing composition.

In certain embodiments, the polishing composition further comprises a corrosion inhibitor. Suitable corrosion inhibitors for use in the polishing compositions and associated methods described herein include benzotriazole, 6-tolyltriazole, 1,2,3-triazole, 1,2,4-triazole, 1-dodecanethiol, 3-amino-triazole, 3-amino-1,2,3-triazole-5-thiol, 1-phenyl-1H-tetrazole-5-thiol, 2-mercaptobenzothiazole, hexanethiol, 5-methyl-1H-benzotriazole, 2-amino-4-thiazole-acetic acid, dodecanethiol and combinations thereof.

In certain embodiments, the polishing composition further comprises a salt. Suitable salts that may be added to the polishing composition include, but are not limited to, ammonium persulfate, potassium persulfate, potassium sulfite, potassium carbonate, ammonium nitrate, potassium hydrogen phthalate, hydroxylamine sulfate, and mixtures thereof. The salts may be present in the polishing composition in a concentration of about 0 weight % to about 10 weight %, or about 0 weight % to about 5 weight % of the total weight of the polishing composition. One particular embodiment of a salt that can be used is ammonium nitrate which is present in a concentration of about 0 weight % to about 0.15 weight % of the total weight of the polishing composition.

In certain embodiments, the polishing composition further comprises biological agents such as bactericides, biocides and fungicides particularly for those embodiments wherein the pH of the polishing composition ranges from about 6 to 9. Suitable biocides, include, but are not limited to, 1,2-benzisothiazolin-3-one; 2(hydroxymethyl)amino ethanol; 1,3-dihydroxymethyl-5,5-dimethylhydantoin; 1-hydroxymethyl-5,5-dimethylhydantion; 3-iodo-2-propynyl butylcarbamate; glutaraldehyde; 1,2-dibromo-2,4-dicyanobutane; 5-chloro-2-methyl-4-isothiazoline-3-one; 2-methyl-4-isothiazolin-3-one; and mixtures thereof.

The associated methods described herein entail use of the aforementioned composition for chemical mechanical planarization of substrates comprised of metals and dielectric materials. In the methods, a substrate (e.g., a wafer) is placed face-down on a polishing pad which is fixedly attached to a rotatable platen of a CMP polisher. In this manner, the substrate to be polished and planarized is placed in direct contact with the polishing pad. A wafer carrier system or polishing head is used to hold the substrate in place and to apply a downward pressure against the backside of the substrate during CMP processing while the platen and the substrate are rotated. The polishing composition (slurry) is applied (usually continuously) on the pad during CMP processing to effect the removal of material to planarize the substrate.

The polishing composition and associated methods described herein are effective for CMP of a wide variety of substrates, including substrates having dielectric portions that comprise materials having dielectric constants less than 3.3 (low-k materials). Suitable low-k films in substrates include, but are not limited to, organic polymers, carbon-doped oxides, fluorinated silicon glass (FSG), inorganic porous oxide-like materials, and hybrid organic-inorganic materials. Representative low-k materials and deposition methods for these materials are summarized below.

| Vendor | Trade Name | Deposition Method | Material |
|---|---|---|---|
| Air Products and Chemicals | MesoElk® | Spin-on | Hybrid organic-inorganic |
| Applied Materials | Black Diamond | CVD | Carbon-doped oxide |
| Dow Chemical | SiLK ™, Porous SiLK ™ | Spin-on | Organic polymer |

-continued

| Vendor | Trade Name | Deposition Method | Material |
|---|---|---|---|
| Honeywell Electronic Materials | NANOGLASS® E | Spin-on | Inorganic oxide-like |
| Novellus Systems | CORAL® | PECVD | Carbon-doped oxide |

PECVD = Plasma enhanced chemical vapor deposition
CVD = chemical vapor deposition Current copper CMP technology uses a two-step process to achieve local and global planarization in the production of IC chips. During copper CMP in step 1, the overburden copper is removed during IC fabrication processing. After removing the overburden copper in step 1, the polished surface still has not achieved local and global planarity due to differences in the step heights between high density and low density features on pattern wafers. After removing the overburden copper in step 1, a high tantalum to copper selectivity is desired to achieve local and global planarization. A challenging task is to maintain high tantalum removal while achieving high tantalum to copper selectivity and protection of the low lying copper regions. If the low lying copper regions are not protected during polishing, this results in a defect commonly known as "dishing". A polishing composition which can increase the tantalum to copper selectivity during polishing in step 2 can reduce "dishing" by providing wide overpolish window during chip fabrication processing.

In one embodiment, method described herein is used for chemical mechanical planarization of a surface having at least one feature thereon comprising a metal, wherein the metal is copper.

The polishing composition and method described herein will be illustrated in more detail with reference to the following Examples, but it should be understood that it is not deemed to be limited thereto.

EXAMPLES

Glossary:
Components
PETEOS Plasma enhanced deposition of tetraethoxy silane, dielectric oxide layer.
Polishing Pad Polishing pad, Politex®, and IC1000 were used during CMP, supplied by Rodel, Inc, Phoenix, Ariz.
TEOS Tetraethyl orthosilicate
Parameters
  General
  Å: angstrom(s)—a unit of length
  BP: back pressure, in psi units
  CMP: chemical mechanical planarization=chemical mechanical polishing
  CS: carrier speed
  DF: Down force: pressure applied during CMP, units psi
  min: minute(s)
  ml: milliliter(s)
  mV: millivolt(s)
  psi: pounds per square inch
  PS: platen rotational speed of polishing tool, in rpm (revolution(s) per minute)
  SF: polishing composition flow, ml/min
Removal Rates and Selectivities
Cu RR 1.5 psi Measured copper removal rate at 1.5 psi down pressure of the CMP tool
Ta RR 1.5 psi Measured tantalum removal rate at 1.5 psi down pressure of the CMP tool TEOS RR 1.5 psi Measured TEOS removal rate at 1.5 psi down pressure of the CMP tool
PETEOS RR 1.5 psi Measured PETEOS removal rate at 1.5 psi down pressure of the CMP tool General Experimental Procedure All percentages are weight percentages unless otherwise indicated. In the prophetic example presented below, CMP experiments are to be run using the procedures and experimental conditions given below. The CMP tool to be used in the examples is a Mirra®, manufactured by Applied Materials, 3050 Boweres Avenue, Santa Clara, Calif., 95054. A Rodel Politex® embossed pad, supplied by Rodel, Inc, 3804 East Watkins Street, Phoenix, Ariz., 85034, is to be used on the platen for the blanket wafer polishing studies. Pads are broken-in by polishing twenty-five dummy oxide (deposited by plasma enhanced CVD from a TEOS precursor, PETEOS) wafers. In order to qualify the tool settings and the pad break-in, two PETEOS monitors are polished with Syton® OX-K colloidal silica, supplied by DuPont Air Products NanoMaterials L.L.C., at baseline conditions. Polishing experiments are conducted using electrochemically deposited copper, tantalum, and PETEOS wafers. These blanket wafers are purchased from Silicon Valley Microelectronics, 1150 Campbell Ave, Calif., 95126. The film thickness specifications are summarized below:
PETEOS: 15,000 Å on silicon
Copper: 10,000 Å electroplated copper/1,000 Å copper seed/ 250 Å Ta on silicon
Tantalum: 2000 Å/5,000 Å thermal oxide on silicon Example 1

Prophetic

A polishing composition consisting of 5 weight percent colloidal silica, 4 weight percent of hydrogen peroxide, and 91 weight percent of water is used as a control (comparative) slurry. The inventive slurry is the same as the control slurry except that the inventive slurry has an additional component of 5000 ppm of a naphthalene imide derivative of Type 1 where R—X and R'—X are methyl groups and R" and R'" are hydrogen atoms. (The inventive slurry also has 5000 ppm less water than the control due to the addition of the naphthalene imide derivative.) CMP experiments to measure copper removal rates and dishing and erosion levels are made using both the inventive and control slurries. It is prophesized that the inventive slurry will afford substantially higher copper removal rates with lower dishing and erosion levels than does the control slurry.

The invention claimed is:
1. A method for chemical mechanical planarization of a surface having at least one feature thereon comprising a metal or a metal alloy, said method comprising the steps of:
A) placing a substrate having the surface having the at least one feature thereon comprising the metal or the metal alloy in contact with a polishing pad;
B) delivering a polishing composition to the surface comprising:
a) an abrasive;
b) a naphthalene imide derivative; and
c) an oxidizing agent; and
C) polishing the substrate with the polishing composition wherein the naphthalene imide derivative comprises at least one selected from the group consisting of

Type 1 naphthalene imide derivative having the following formula:

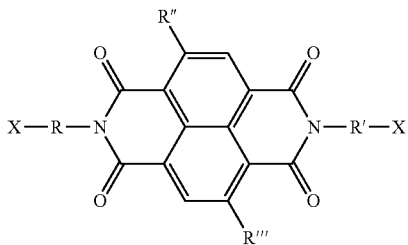

where substituents R, X, R', R", and R'" are independently from a hydrogen atom, a linear, branched, or cyclic alkyl group comprising from 1 to 20 carbon atoms, an alkoxy group, alkoxy, an alkyl thioether group, a cyano group, a carboxylic acid group, a carboxylic ester group, an ethylene glycol radical, an amino acid group, and an imine group;

Type 2 naphthalene imide derivative having the following formula:

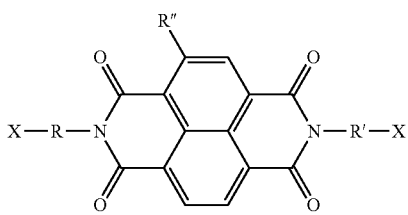

where substituents R, X, R', and R" are independently from a hydrogen atom, a linear, branched, or cyclic alkyl group comprising from 1 to 20 carbon atoms, an alkoxy group, alkoxy, an alkyl thioether group, a cyano group, a carboxylic acid group, a carboxylic ester group, an ethylene glycol radical, an amino acid group, and an imine group;
and Type 3 naphthalene imide derivative having the following formula:

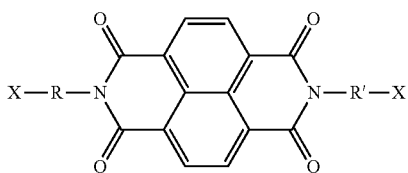

where substituents R, X, and R' are independently from a hydrogen atom, a linear, branched, or cyclic alkyl group comprising from 1 to 20 carbon atoms, an alkoxy group, alkoxy, an alkyl thioether group, a cyano group, a carboxylic acid group, a carboxylic ester group, an ethylene glycol radical, an amino acid group, and an imine group.

2. The method of claim 1 wherein the naphthalene imide derivate comprises the Type 1 naphthalene derivative having the following formula:

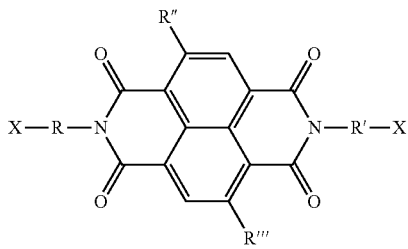

where substituents R, X, R', R", and R''' are independently from a hydrogen atom, a linear, branched, or cyclic alkyl group comprising from 1 to 20 carbon atoms, an alkoxy group, alkoxy, an alkyl thioether group, a cyano group, a carboxylic acid group, a carboxylic ester group, an ethylene glycol radical, an amino acid group, and an imine group.

3. The method of claim 1 wherein the naphthalene imide derivate comprises the Type 2 naphthalene derivative having the following formula:

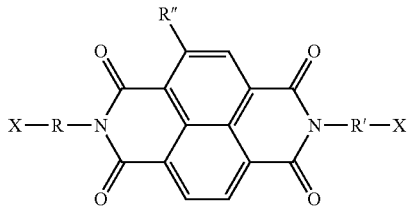

where substituents R, X, R', and R" are independently from a hydrogen atom, a linear, branched, or cyclic alkyl group comprising from 1 to 20 carbon atoms, an alkoxy group, alkoxy, an alkyl thioether group, a cyano group, a carboxylic acid group, a carboxylic ester group, an ethylene glycol radical, an amino acid group, and an imine group.

4. The method of claim 1 wherein the naphthalene imide derivated comprises the Type 3 naphthalene derivative having the following formula:

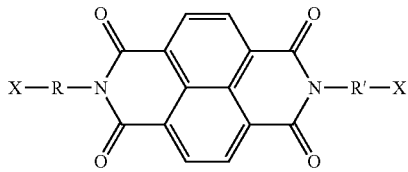

where substituents R, X, and R' are independently from a hydrogen atom, a linear, branched, or cyclic alkyl group comprising from 1 to 20 carbon atoms, an alkoxy group, alkoxy, an alkyl thioether group, a cyano group, a carboxylic acid group, a carboxylic ester group, an ethylene glycol radical, an amino acid group, and an imine group.

5. A polishing composition comprising:
   a) an abrasive;
   b) a naphthalene imide derivative; and
   c) an oxidizing agent.
   wherein the naphthalene imide derivative is selected from the group consisting of Type 1 naphthalene imide derivative having the following formula:

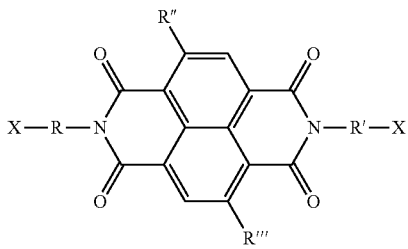

where substituents R, X, R', R", and R''' are independently from a hydrogen atom, a linear, branched, or cyclic alkyl group comprising from 1 to 20 carbon atoms, an alkoxy group, alkoxy, an alkyl thioether group, a cyano group, a carboxylic acid group, a carboxylic ester group, an ethylene glycol radical, an amino acid group, and an imine group;

Type 2 naphthalene imide derivative having the following formula:

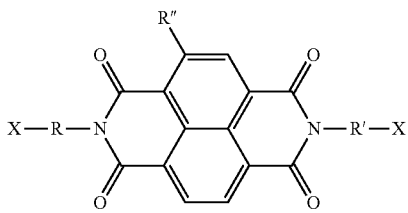

where substituents R, X, R', and R" are independently from a hydrogen atom, a linear, branched, or cyclic alkyl group comprising from 1 to 20 carbon atoms, an alkoxy group, alkoxy, an alkyl thioether group, a cyano group, a carboxylic acid group, a carboxylic ester group, an ethylene glycol radical, an amino acid group, and an imine group;
and
Type 3 naphthalene imide derivative having the following formula:

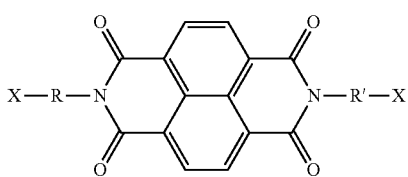

where substituents R, X, and R' are independently from a hydrogen atom, a linear, branched, or cyclic alkyl group comprising from 1 to 20 carbon atoms, an alkoxy group, alkoxy, an alkyl thioether group, a cyano group, a carboxylic acid group, a carboxylic ester group, an ethylene glycol radical, an amino acid group, and an imine group.

6. The polishing composition of claim 5 wherein the naphthalene imide derivate comprises the Type 1 naphthalene derivative having the following formula:

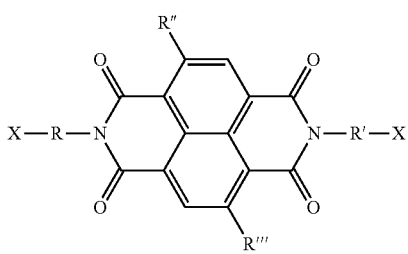

where substituents R, X, R', R", and R''' are independently from a hydrogen atom, a linear, branched, or cyclic alkyl group comprising from 1 to 20 carbon atoms, an alkoxy group, alkoxy, an alkyl thioether group, a cyano group, a carboxylic acid group, a carboxylic ester group, an ethylene glycol radical, an amino acid group, and an imine group.

7. The polishing composition of claim 5 wherein the naphthalene imide derivate comprises the Type 2 naphthalene derivative having the following formula:

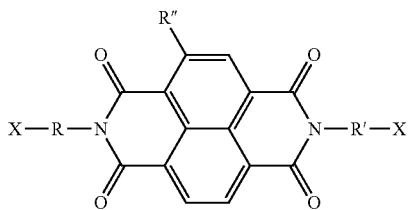

where substituents R, X, R', and R" are independently from a hydrogen atom, a linear, branched, or cyclic alkyl group comprising from 1 to 20 carbon atoms, an alkoxy group, alkoxy, an alkyl thioether group, a cyano group, a carboxylic acid group, a carboxylic ester group, an ethylene glycol radical, an amino acid group, and an imine group.

8. The method of claim 5 wherein the naphthalene imide derivate comprises the Type 3 naphthalene derivative having the following formula:

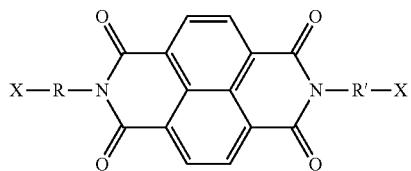

where substituents R, X, and R' are independently from a hydrogen atom, a linear, branched, or cyclic alkyl group comprising from 1 to 20 carbon atoms, an alkoxy group, alkoxy, an alkyl thioether group, a cyano group, a carboxylic acid group, a carboxylic ester group, an ethylene glycol radical, an amino acid group, and an imine group.

* * * * *